United States Patent
Wang (10) Patent No.: US 9,800,219 B2
(45) Date of Patent: Oct. 24, 2017

(54) APPARATUS FOR PERFORMING CAPACITOR AMPLIFICATION IN AN ELECTRONIC DEVICE

(71) Applicant: MEDIATEK INC., Hsin-Chu (TW)

(72) Inventor: Huai-Te Wang, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/147,902

(22) Filed: May 5, 2016

(65) Prior Publication Data
US 2017/0085234 A1   Mar. 23, 2017

Related U.S. Application Data

(60) Provisional application No. 62/222,434, filed on Sep. 23, 2015.

(51) Int. Cl.
*H03F 1/34*    (2006.01)
*H03F 3/50*    (2006.01)

(52) U.S. Cl.
CPC ............. *H03F 3/505* (2013.01); *H03F 1/342* (2013.01); *H03F 2200/129* (2013.01);
(Continued)

(58) Field of Classification Search
CPC ...................................................... H03F 3/505
(Continued)

(56) References Cited

U.S. PATENT DOCUMENTS

| 5,453,711 | A | * | 9/1995 | Yamamoto | G06G 7/14 327/355 |
| 5,500,622 | A | * | 3/1996 | Muramatsu | H04R 5/04 330/107 |

(Continued)

FOREIGN PATENT DOCUMENTS

| EP | 1 748 551 A2 | 1/2007 |
| EP | 1 748 551 A3 | 8/2007 |

OTHER PUBLICATIONS

Jie Gu et al., Design and Implementation of Active Decoupling Capacitor Circuits for Power Supply Regulation in Digital ICs, Feb. 1, 2009, pp. 292-301, IEEE Transactions on Very Large Scale Integration (VLSI) System, vol. 17, No. 2, XP011241138.
(Continued)

*Primary Examiner* — Khanh V Nguyen
*Assistant Examiner* — Khiem Nguyen
(74) *Attorney, Agent, or Firm* — Winston Hsu (57) ABSTRACT

An apparatus for performing capacitor amplification in an electronic device may include a first resistor and a second resistor that are connected in series and coupled between a set of input terminals of a receiver in the electronic device, a common mode capacitor having a first terminal coupled to a common mode terminal and having a second terminal, and an alternating current (AC)-coupled amplifier that is coupled between the common mode terminal and the second terminal of the common mode capacitor. The first resistor and the second resistor may be arranged for obtaining a common mode voltage at the common mode terminal between the first resistor and the second resistor. In addition, the common mode capacitor may be arranged for reducing a common mode return loss. Additionally, the AC-coupled amplifier may be arranged for performing capacitor amplification for the common mode capacitor.

12 Claims, 6 Drawing Sheets

(52) U.S. Cl.
CPC .... *H03F 2200/144* (2013.01); *H03F 2200/21* (2013.01); *H03F 2200/303* (2013.01); *H03F 2200/42* (2013.01); *H03F 2200/69* (2013.01); *H03F 2203/45061* (2013.01); *H03F 2203/45084* (2013.01); *H03F 2203/5024* (2013.01)

(58) Field of Classification Search
USPC .......................................... 330/293, 69, 258
See application file for complete search history.

(56) References Cited

U.S. PATENT DOCUMENTS

| | | | |
|---|---|---|---|
| 7,995,660 B2 | 8/2011 | Cox | |
| 8,664,973 B2 | 3/2014 | Ali | |
| 2007/0279126 A1* | 12/2007 | Krishnan | H03F 1/34 330/10 |

OTHER PUBLICATIONS

Jie Gu et al., Distributed Active Decoupling Capacitors for On-Chip Supply Noise Cancellation in Digital VLSI Circuits, Jan. 1, 2006, 2006 Symposium on VLSI Circuits Digest of Technical Papers, XP002766305.

Toshiro Tsukada et al., An On-Chip Active Decoupling Circuit to Suppress Crosstalk in Deep-Submicron CMOS Mixed-Signal SoCs, Jan. 1, 2005, pp. 67-79, IEEE Journal of Solid-State Circuits, vol. 40, No. 1, XP011124404.

\* cited by examiner

APPARATUS FOR PERFORMING CAPACITOR AMPLIFICATION IN AN ELECTRONIC DEVICE

CROSS REFERENCE TO RELATED APPLICATIONS

This application claims the benefit of U.S. Provisional Application No. 62/222,434, which was filed on Sep. 23, 2015 and is included herein by reference.

BACKGROUND

The present invention relates to alternating current (AC)-coupled capacitor amplification for common-mode termination, and more particularly, to an apparatus for performing capacitor amplification in an electronic device.

According to the related art, a direct current (DC) coupling system may be designed to have a floating termination architecture, and it looks like open circuit in one or more situations. Based on this design, some problems may occur. For example, a capacitor having a capacitance value of more than one hundred picofarad (pF) may be required, causing the associated chip area to be increased. As a result, the associated costs are increased. Some conventional methods are proposed to try solving the problems, but additional problems such as some side effects may occur. For example, a receiver may need a wide input range of bandwidth and may require strong signal driving of an amplifier, causing increased costs and increased power consumption. In another example, a receiver may suffer from a slow operation speed and a large input common mode tolerance. In another example, a receiver may suffer from DC leakage due to a mismatch issue and suffer from implementing a complicated circuit that still increases the chip area, and may need wide range driving. Thus, a novel architecture is required for performing capacitor amplification, in order to save the chip area.

SUMMARY

It is an objective of the claimed invention to provide an apparatus for performing capacitor amplification in an electronic device, in order to solve the above-mentioned problems.

It is another objective of the claimed invention to provide an apparatus for performing capacitor amplification in an electronic device, in order to guarantee the overall performance of the whole system.

According to at least one preferred embodiment, an apparatus for performing capacitor amplification in an electronic device is provided, where the apparatus may comprise at least one portion (e.g. a portion or all) of the electronic device. For example, the apparatus may comprise a first resistor and a second resistor that are connected in series and coupled between a set of input terminals of a receiver in the electronic device, and may comprise a common mode capacitor having a first terminal coupled to a common mode terminal and having a second terminal, and may further comprise an alternating current (AC)-coupled amplifier that is coupled between the common mode terminal and the second terminal of the common mode capacitor. The first resistor and the second resistor may be arranged for obtaining a common mode voltage at the common mode terminal between the first resistor and the second resistor. In addition, the common mode capacitor may be arranged for reducing a common mode return loss. Additionally, the AC-coupled amplifier may be arranged for performing capacitor amplification for the common mode capacitor.

It is an advantage of the present invention that the present invention apparatus can guarantee the overall performance of the whole system. For example, by using the AC-coupled amplifier, the present invention apparatus can reduce the required input dynamic range. In addition, the present invention apparatus can use the AC-coupled amplifier to perform capacitor amplification on the common mode capacitor. By using the AC-coupled amplifier, the required capacitance value of the common mode capacitor can be greatly decreased without degrading the performance of the whole system, and therefore the present invention apparatus eliminates the need of implementing a capacitor having a capacitance value of more than one hundred picofarad (pF) for a direct current (DC) coupling system such as that mentioned above, so the chip area of an integrated circuit (IC) can be saved. As a result, the related art problems can be prevented.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
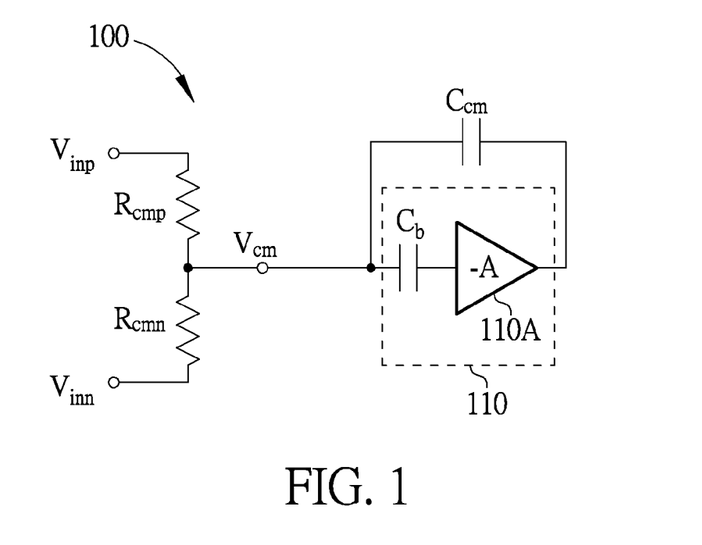
FIG. 1 is a diagram of an apparatus for performing capacitor amplification in an electronic device according to an embodiment of the present invention.

FIG. 1 is a diagram of an apparatus 100 for performing capacitor amplification in an electronic device according to an embodiment of the present invention, where the apparatus 100 may comprise at least one portion of the electronic device. For example, the apparatus 100 may comprise a portion of the electronic device mentioned above, and more particularly, can be at least one hardware circuit such as at least one integrated circuit (IC) within the electronic device and associated circuits thereof. In another example, the apparatus 100 can be the whole of the electronic device mentioned above. In another example, the apparatus 100 may comprise a system comprising the electronic device mentioned above (e.g. a wireless communications system comprising the electronic device). Examples of the electronic device may include, but not limited to, a multifunctional mobile phone, a tablet, a wearable device, and a laptop computer.

As shown in FIG. 1, the apparatus 100 may comprise a first resistor $R_{cmp}$ and a second resistor $R_{cmn}$ that are connected in series and coupled between a set of input terminals of a receiver in the electronic device, such as two input terminals $V_{inp}$ and $V_{inn}$ of the receiver, and may comprise a common mode capacitor $C_{cm}$ having a first terminal (e.g. the left terminal thereof in the architecture shown in FIG. 1) coupled to a common mode terminal $V_{cm}$ and having a second terminal (e.g. the right terminal thereof in the architecture shown in FIG. 1). For example, the two input terminals $V_{inp}$ and $V_{inn}$ may be two differential input terminals, and all input terminals of the set of input terminals comprising the two input terminals $V_{inp}$ and $V_{inn}$ may be voltage input terminals. In addition, the apparatus 100 may further comprise a capacitor amplification circuit 110 that is utilized as a capacitor multiplier. As shown in FIG. 1, the capacitor amplification circuit 110 of this embodiment may comprise an alternating current (AC)-coupled amplifier 110A that is coupled between the common mode terminal $V_{cm}$ and the second terminal of the common mode capacitor $C_{cm}$. For example, the AC-coupled amplifier 110A may have an input terminal (e.g. the left terminal thereof in the architecture shown in FIG. 1) and an output terminal (e.g. the right terminal thereof in the architecture shown in FIG. 1), and the input terminal of the AC-coupled amplifier 110A may be coupled to the common mode terminal $V_{cm}$, and the output terminal of the AC-coupled amplifier 110A may be coupled to the second terminal of the common mode capacitor $C_{cm}$. According to this embodiment, the capacitor amplification circuit 110 may further comprise an AC-coupling capacitor $C_b$ that may be arranged for coupling (e.g., AC-coupling) the input terminal of the AC-coupled amplifier 110A to the common mode terminal $V_{cm}$, where the AC-coupling capacitor $C_b$ may have a first terminal (e.g. the left terminal thereof in the architecture shown in FIG. 1) coupled to the common mode terminal $V_{cm}$, and may have a second terminal (e.g. the right terminal thereof in the architecture shown in FIG. 1) coupled to the input terminal of the AC-coupled amplifier. For example, by properly designing the AC-coupled amplifier 110A, the gain of the AC-coupled amplifier 110A may be equal to $-A$ (e.g. the parameter A is a positive value that is equal to or greater than one, and may be defined as the inband gain of the AC-coupled amplifier 110A), and therefore, the AC-coupled amplifier 110A is labeled "$-A$" in FIG. 1, for better comprehension. As a result of utilizing the AC-coupled amplifier 110A, the equivalent capacitance $C_{cm\text{-}Eq}$ of the common mode capacitor $C_{cm}$ may be express as follows:

$$C_{cm\text{-}Eq}=(1+A)*C_{cm};$$

where the notation "$C_{cm}$" may represent the capacitance value (i.e. the real capacitance value) of the common mode capacitor $C_{cm}$. Preferably, all of these components may be implemented on an IC such as that mentioned above.

According to this embodiment, the first resistor and the second resistor may be arranged for obtaining a common mode voltage $V_{cm}$ at the common mode terminal $V_{cm}$ between the first resistor $R_{cmp}$ and the second resistor $R_{cmn}$, and the common mode capacitor $C_{cm}$ may be arranged for reducing a common mode return loss. In addition, the AC-coupled amplifier 110A may be arranged for performing capacitor amplification for the common mode capacitor $C_{cm}$. For example, operations of the capacitor amplification circuit 110 may make the common mode capacitor $C_{cm}$ to have the equivalent capacitance $C_{cm\text{-}Eq}$ that is greater than the real capacitance value $C_{cm}$ of the common mode capacitor $C_{cm}$. In this embodiment, the capacitor amplification circuit 110 may emulate greater capacitance of the common mode capacitor $C_{cm}$ than the common mode capacitor $C_{cm}$ really have. For example, in a situation where the capacitance value $C_{cm}$ of the common mode capacitor $C_{cm}$ does not reach 100 picofarad (pF), by utilizing the capacitor amplification circuit 110, the apparatus 100 can guarantee the performance of the receiver and the overall performance of the whole system without further increasing the size of the common mode capacitor $C_{cm}$ (e.g. having no need to reserve a larger sub-area on the IC for implementing the common mode capacitor $C_{cm}$), since the capacitor amplification circuit 110 may make the capacitance of the common mode capacitor $C_{cm}$ seem to become greater than 100 pF.

Based on the architecture shown in FIG. 1, the apparatus 100 can perform capacitor amplification for the common mode capacitor $C_{cm}$ without introducing additional problems such as that of the related art (e.g. the problems of needing a wide input range of bandwidth and requiring strong signal driving of an amplifier, the problems of suffering from a slow operation speed and a large input common mode tolerance, and the problems of suffering from DC leakage due to a mismatch issue and suffering from implementing a complicated circuit that still increases the chip are, and needing wide range driving).

For better comprehension, the first resistor $R_{cmp}$ and the second resistor $R_{cmn}$, together with the two input terminals $V_{inp}$ and $V_{inn}$ of the receiver, are illustrated in FIG. 1. According to some embodiments, the apparatus 100 may comprise only a portion of the architecture shown in FIG. 1. According to some embodiments, the apparatus 100 may comprise the receiver. In some embodiments, such as the embodiment shown in FIG. 1, the typical value of each of the first resistor $R_{cmp}$ and the second resistor $R_{cmn}$ may be equal to 50 Ohm. In some embodiments, the typical value of each of the first resistor $R_{cmp}$ and the second resistor $R_{cmn}$ may be equal to any of some other values.

Figure 2:
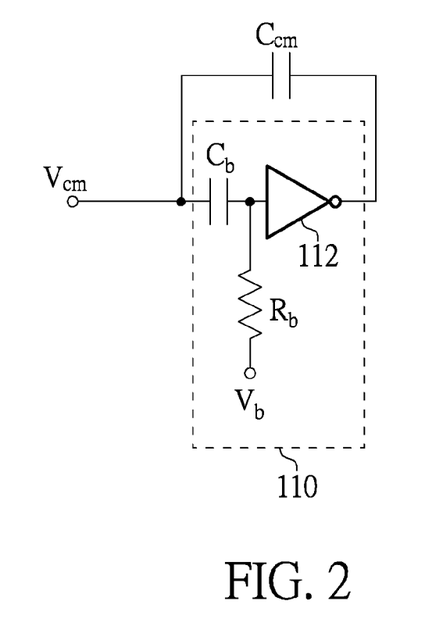
FIG. 2 illustrates some implementation details of the alternating current (AC)-coupled amplifier shown in FIG. 1 according to an embodiment of the present invention.

FIG. 2 illustrates some implementation details of the AC-coupled amplifier 110A shown in FIG. 1 according to an embodiment of the present invention. For example, the AC-coupled amplifier 110A shown in FIG. 1 may comprise an inverter 112 and a resistor $R_b$ in this embodiment. The inverter 112 may have an input terminal (e.g. the left terminal thereof in the architecture shown in FIG. 2) coupled to the input terminal of the AC-coupled amplifier 110A, and may have an output terminal (e.g. the right terminal thereof in the architecture shown in FIG. 2) coupled to the output terminal of the AC-coupled amplifier 110A. In addition, the resistor $R_b$ may have a first terminal (e.g. the upper terminal thereof in the architecture shown in FIG. 2) coupled to the input terminal of the AC-coupled amplifier 110A, and may have a second terminal (e.g. the lower terminal thereof in the architecture shown in FIG. 2) that is electrically connected to a bias terminal $V_b$, where the bias terminal $V_b$ may be utilized for receiving a bias voltage.

By using the architecture shown in FIG. 2, the apparatus 100 can perform capacitor amplification for the common mode capacitor $C_{cm}$ without introducing additional problems such as that of the related art. For example, no wide range amplifier is needed, and no complicated circuit is needed. In addition, as long as performing capacitor amplification for the common mode capacitor $C_{cm}$ will not be hindered, the bias voltage applied to the bias terminal $V_b$ may be arbitrarily selected from various kinds of options. Examples of the bias voltage applied to the bias terminal $V_b$ may include, but not limited to, a predetermined voltage level, an existing voltage level in the apparatus 100, and a varying voltage level in the architecture shown in any of FIGS. 1-2.

Figure 3:
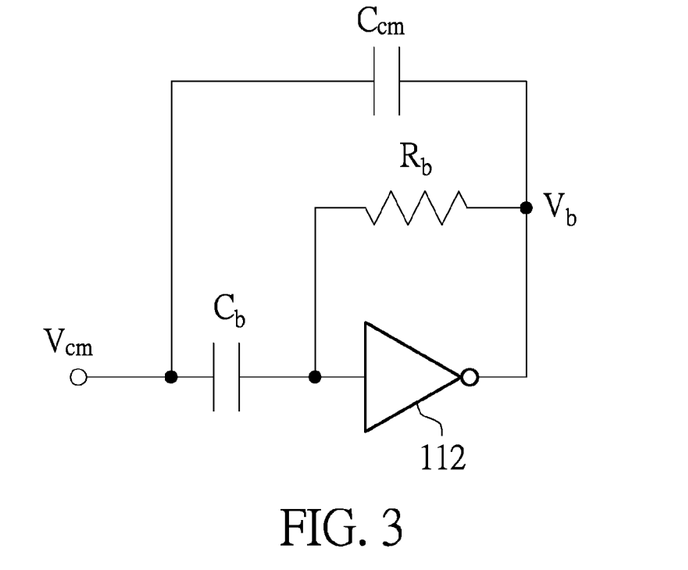
FIG. 3 illustrates a hardware configuration of the AC-coupled amplifier shown in FIG. 2 according to an embodiment of the present invention.

FIG. 3 illustrates a hardware configuration of the architecture shown in FIG. 2 according to an embodiment of the present invention. As shown in FIG. 3, the bias terminal $V_b$ may be electrically connected to the output terminal of the inverter 112. In addition, as the output terminal of the inverter 112 may be regarded as the output terminal of the AC-coupled amplifier 110A shown in FIG. 1, the bias terminal $V_b$ may be coupled to the output terminal of the AC-coupled amplifier 110A shown in FIG. 1 in this embodiment. Based on the architecture shown in FIG. 3, the output terminal of the AC-coupled amplifier 110A (e.g. the output terminal of the inverter 112) and the second terminal of the common mode capacitor $C_{cm}$ (e.g. the right terminal thereof) are electrically connected to each other, directly. For brevity, similar descriptions for this embodiment are not repeated in detail here.

Figure 4:
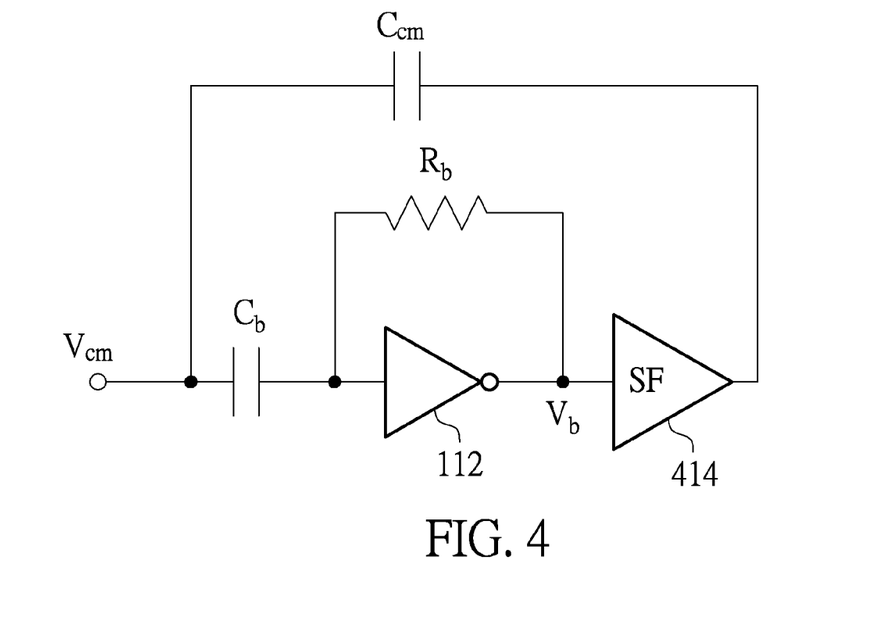
FIG. 4 illustrates some implementation details of the apparatus shown in FIG. 1 according to an embodiment of the present invention.

FIG. 4 illustrates some implementation details of the apparatus 100 shown in FIG. 1 according to an embodiment of the present invention. As shown in FIG. 4, the apparatus 100 may further comprise a source follower (SF) 414 that is coupled between the output terminal of the AC-coupled amplifier 110A (e.g. the output terminal of the inverter 112) and the second terminal of the common mode capacitor $C_{cm}$ (e.g. the right terminal thereof). For example, the input terminal of the source follower 414 is coupled to the output terminal of the inverter 112, and the output terminal of the source follower 414 is coupled to second terminal of the common mode capacitor $C_{cm}$ (e.g. the right terminal thereof). Based on the architecture shown in FIG. 4, the capacitor amplification circuit 110 shown in FIG. 1 may comprise the source follower 414, and may perform capacitor amplification for the common mode capacitor $C_{cm}$ with aid of the source follower 414. For example, during perform capacitor amplification for the common mode capacitor $C_{cm}$, the source follower 414 may provide the capacitor amplification circuit 110 shown in FIG. 1 with some good features such as low output impedance with proper output power. As a result, the bandwidth of the capacitor amplification operation can be greatly increased. For brevity, similar descriptions for this embodiment are not repeated in detail here.

Figure 5:
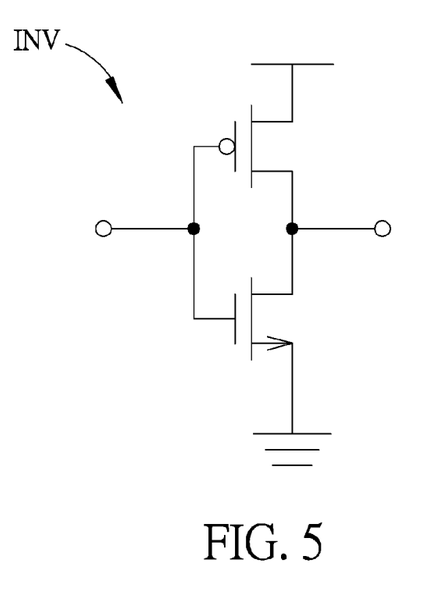
FIG. 5 illustrates a gain stage involved with the apparatus shown in FIG. 1 according to an embodiment of the present invention.

FIG. 5 illustrates a gain stage involved with the apparatus 100 shown in FIG. 1 according to an embodiment of the present invention, where the leftmost terminal and the rightmost terminal in the architecture shown in FIG. 5 are the input terminal and the output terminal of the gain stage, respectively. For example, the gain stage of this embodiment may comprise a plurality of Metal Oxide Semiconductor Field Effect Transistors (MOSFETs) coupled to each other, such as a P-type MOSFET (PMOSFET) and a N-type MOSFET (NMOSFET) that are coupled between a set of predetermined voltage levels, such as a driving voltage level at a driving terminal and a ground voltage level at a ground terminal. Based on the architecture shown in FIG. 5, the gain stage can be regarded as an inverter circuit INV. This gain stage (labeled "INV" in FIG. 5, for better comprehension) can be utilized for implementing the inverter 112 in the architecture shown in FIG. 3, and can be utilized for implementing the inverter 112 in the architecture shown in FIG. 4. For brevity, similar descriptions for this embodiment are not repeated in detail here.

Figure 6:
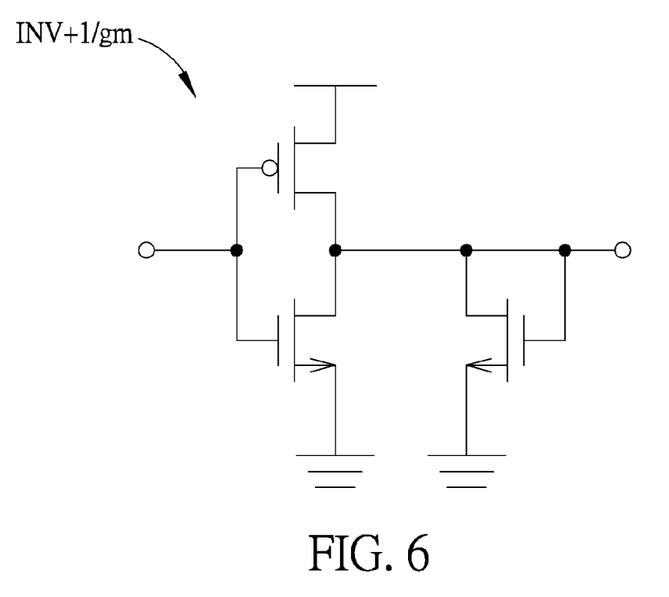
FIG. 6 illustrates a gain stage involved with the apparatus shown in FIG. 1 according to another embodiment of the present invention.

FIG. 6 illustrates a gain stage involved with the apparatus 100 shown in FIG. 1 according to another embodiment of the present invention, where the leftmost terminal and the rightmost terminal in the architecture shown in FIG. 6 are the input terminal and the output terminal of the gain stage, respectively. For example, the gain stage of this embodiment may comprise the inverter circuit INV, and may further comprise a diode connected MOSFET such as a diode connected NMOSFET coupled between the output terminal and the ground terminal (i.e. the MOSFET shown around the lower right of FIG. 6), where two of the three terminals of the diode connected MOSFET, such as the gate terminal thereof and one of the others within the three terminals, are electrically connected to each other. Based on the arrangement in the architecture shown in FIG. 6, the gain stage can be regarded as a combination of the inverter circuit INV and the diode connected MOSFET having the transconductance gm. This gain stage (labeled "INV+1/gm" in FIG. 6, for better comprehension) can be utilized for implementing the inverter 112 in the architecture shown in FIG. 3, and can be utilized for implementing the inverter 112 in the architecture shown in FIG. 4. With aid of the diode connected MOSFET, the inverter circuit INV may provide the capacitor amplification circuit 110 shown in FIG. 1 with some good features such as better linearity and less process variation. For brevity, similar descriptions for this embodiment are not repeated in detail here.

According to some embodiments, the diode connected MOSFET can be implemented with a diode connected PMOSFET. For brevity, similar descriptions for this embodiment are not repeated in detail here.

According to some embodiments, the inverter 112 shown in FIG. 2 may comprise a first MOSFET and a second MOSFET that are coupled between the set of predetermined voltage levels, such as the PMOSFET and the NMOSFET in the inverter circuit INV of any of the embodiments respectively shown in FIGS. 5-6. In addition, the input terminal of the inverter 112 may be electrically connected to the gate terminal of the first MOSFET and the gate terminal of the second MOSFET, and the output terminal of the inverter 112 may be electrically connected to another terminal of the first MOSFET and another terminal of the second MOSFET. Additionally, yet another terminal of the first MOSFET may be electrically connected to one of the set of predetermined voltage levels, and yet another terminal of the second MOSFET may be electrically connected to another of the set of predetermined voltage levels. For brevity, similar descriptions for these embodiments are not repeated in detail here.

According to some embodiments, the inverter 112 shown in FIG. 2 may further comprise a third MOSFET having a gate terminal electrically connected to the output terminal of the inverter 112 and having other terminals, such as the diode connected MOSFET mentioned in the embodiment shown in FIG. 6. In addition, one of the other terminals of the third MOSFET may be electrically connected to the aforementioned one of the set of predetermined voltage levels, and another of the other terminals of the third MOSFET may be electrically connected to the output terminal of the inverter. For brevity, similar descriptions for these embodiments are not repeated in detail here.

Figure 7:
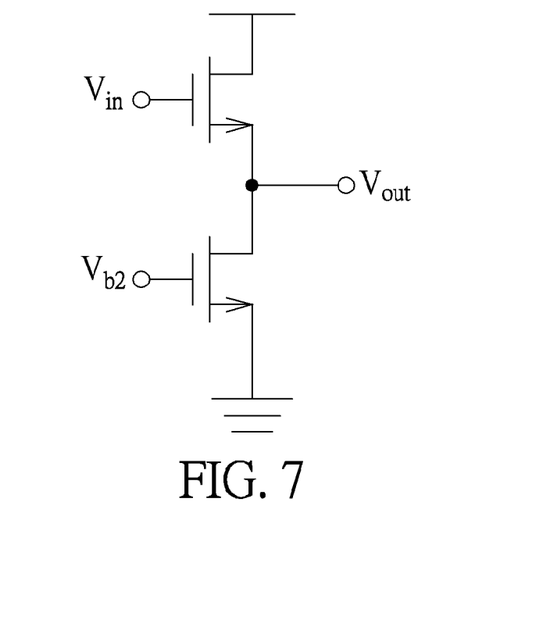
FIG. 7 illustrates a source follower circuit involved with the apparatus shown in FIG. 1 according to an embodiment of the present invention.

FIG. 7 illustrates a source follower circuit involved with the apparatus 100 shown in FIG. 1 according to an embodiment of the present invention, where the terminals $V_{in}$ and $V_{out}$ are the input terminal and the output terminal of the source follower circuit, respectively. The bias terminal $V_{b2}$ of the source follower circuit is arranged for receiving a predetermined bias voltage, for controlling the MOSFET shown in the lower half of FIG. 7 to stay in the saturation region thereof. The source follower circuit of this embodiment can be utilized for implementing the source follower 414 shown in FIG. 4. For brevity, similar descriptions for this embodiment are not repeated in detail here.

Figure 8:
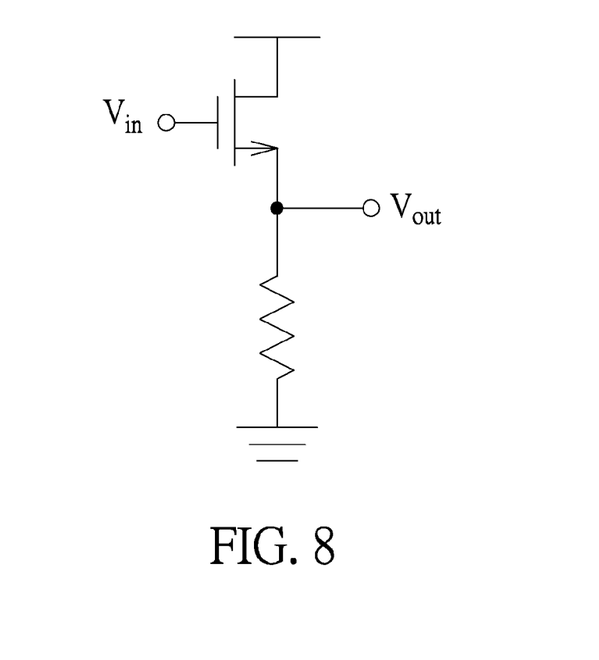
FIG. 8 illustrates a source follower circuit involved with the apparatus shown in FIG. 1 according to another embodiment of the present invention.

FIG. 8 illustrates a source follower circuit involved with the apparatus 100 shown in FIG. 1 according to another embodiment of the present invention, where the terminals $V_{in}$ and $V_{out}$ are the input terminal and the output terminal of the source follower circuit, respectively. In comparison with the architecture shown in FIG. 7, one of the MOSFETs can be replaced by a resistor in this embodiment. The source follower circuit of this embodiment can be utilized for implementing the source follower 414 shown in FIG. 4. For brevity, similar descriptions for this embodiment are not repeated in detail here.

According to some embodiments, the receiver may comply with a specific specification such as the band-pass common-mode return loss (i.e., band-pass SCC11) specification, and the AC-coupled amplifier 110A of any of the above embodiments is especially suitable for performing capacitor amplification, to guarantee the performance of the receiver and the overall performance of the whole system without further increasing the size of the common mode capacitor $C_{cm}$. Here, the term "band-pass SCC11" means the specification defines the required SCC11 from a specific lowest frequency to a specific highest frequency. For example, in a situation where a designer of the electronic device only cares about a specific frequency band above 50 megahertz (MHz) to a few gigahertz (GHz), with the ac-coupling, the AC-coupled amplifier 110A can tolerate a larger transmitter (TX) common-mode input level than that of the related art. In some embodiments, the AC-coupled amplifier 110A may be implemented in a core device to further increase the operation speed of the receiver.

Figure 9:
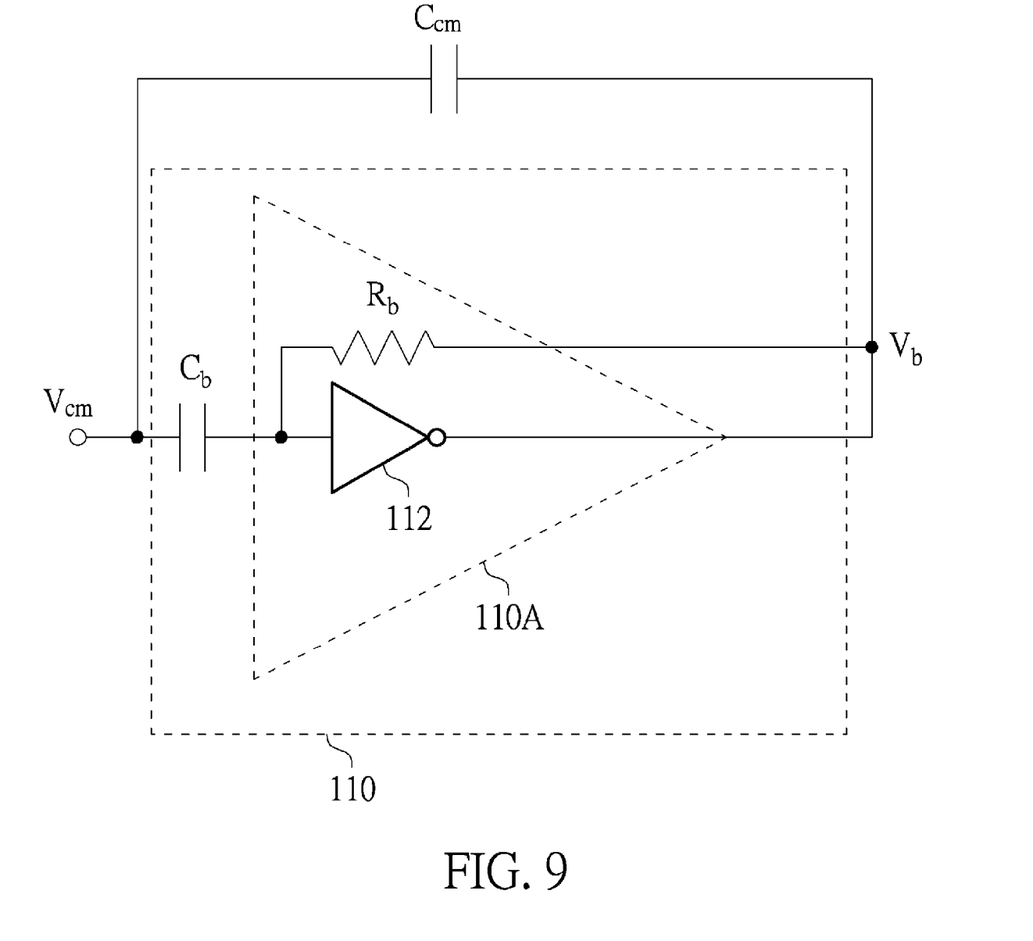
FIG. 9 illustrates an example of the capacitor amplification circuit shown in FIG. 1.

FIG. 9 illustrates an example of the capacitor amplification circuit 110 shown in FIG. 1. The capacitor amplification circuit 110 may comprise the AC-coupled amplifier 110A and the AC-coupling capacitor $C_b$, and the AC-coupled amplifier 110A may comprise the inverter 112 and the resistor $R_b$. The inverter 112 may have the input terminal (e.g. the left terminal thereof in the architecture shown in FIG. 9) coupled to the input terminal of the AC-coupled amplifier 110A, and may have the output terminal (e.g. the right terminal thereof in the architecture shown in FIG. 9) coupled to the output terminal of the AC-coupled amplifier 110A.

Figure 10:
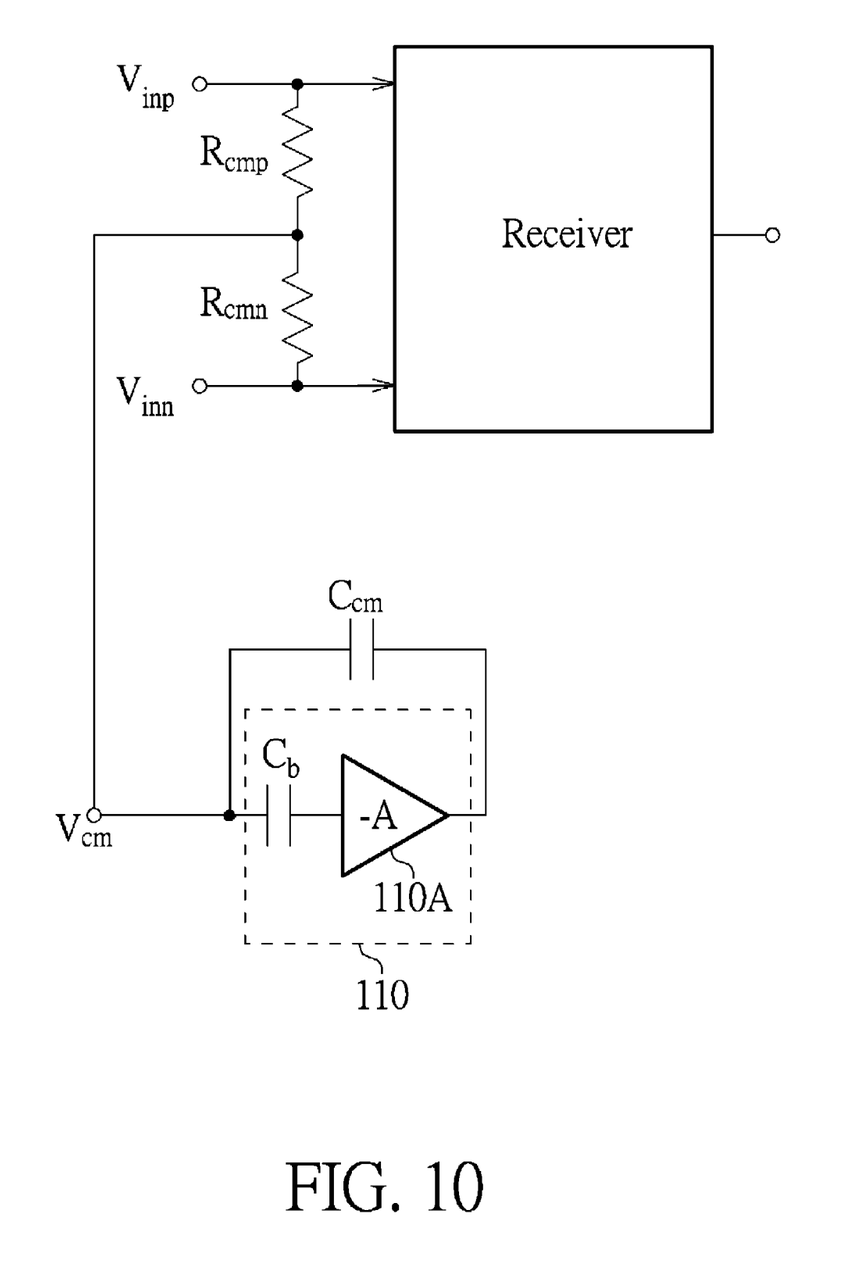
FIG. 10 illustrates some implementation details of the apparatus shown in FIG. 1 according to an embodiment of the present invention.

FIG. 10 illustrates some implementation details of the apparatus 100 shown in FIG. 1 according to an embodiment of the present invention. The first resistor $R_{cmp}$ and the second resistor $R_{cmn}$ that are connected in series are coupled between the set of input terminals of the receiver in the electronic device, such as the two input terminals $V_{inp}$ and $V_{inn}$ of the receiver.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing capacitor amplification in an electronic device, the apparatus comprising:
    a first resistor and a second resistor, connected in series and coupled between a set of input terminals of a receiver in the electronic device, arranged for obtaining a common mode voltage at a common mode terminal between the first resistor and the second resistor, wherein the set of input terminals is arranged to input signals into the receiver;
    a common mode capacitor, having a first terminal coupled to the common mode terminal and having a second terminal, arranged for reducing a common mode return loss; and
    an alternating current (AC)-coupled amplifier, coupled between the common mode terminal and the second terminal of the common mode capacitor, arranged for performing capacitor amplification for the common mode capacitor, wherein an inverter within the AC-coupled amplifier is coupled between the common mode terminal and the second terminal of the common mode capacitor.

2. The apparatus of claim 1, wherein the set of input terminals comprises two differential input terminals.

3. The apparatus of claim 1, wherein all input terminals of the set of input terminals are voltage input terminals.

4. The apparatus of claim 1, wherein the AC-coupled amplifier has an input terminal and an output terminal; and the input terminal of the AC-coupled amplifier is coupled to the common mode terminal, and the output terminal of the AC-coupled amplifier is coupled to the second terminal of the common mode capacitor.

5. The apparatus of claim 4, further comprising:
    an AC-coupling capacitor, arranged for coupling the input terminal of the AC-coupled amplifier to the common mode terminal, wherein the AC-coupling capacitor has a first terminal coupled to the common mode terminal, and has a second terminal coupled to the input terminal of the AC-coupled amplifier.

6. The apparatus of claim 4, wherein a gain of the AC-coupled amplifier is equal to −A, wherein the parameter A is a positive value that is equal to or greater than one.

7. The apparatus of claim 4, wherein the AC-coupled amplifier comprises:
    the inverter, having an input terminal coupled to the input terminal of the AC-coupled amplifier, and having an output terminal coupled to the output terminal of the AC-coupled amplifier; and
    a resistor, having a first terminal coupled to the input terminal of the AC-coupled amplifier, and having a second terminal coupled to the output terminal of the AC-coupled amplifier.

8. The apparatus of claim 7, wherein the output terminal of the AC-coupled amplifier and the second terminal of the common mode capacitor are electrically connected to each other, directly.

9. The apparatus of claim 7, further comprising:
a source follower, coupled between the output terminal of the AC-coupled amplifier and the second terminal of the common mode capacitor.

10. The apparatus of claim 7, wherein the inverter comprises:
a first Metal Oxide Semiconductor Field Effect Transistor (MOSFET) and a second MOSFET, coupled between a set of predetermined voltage levels, wherein the input terminal of the inverter is electrically connected to a gate terminal of the first MOSFET and a gate terminal of the second MOSFET, and the output terminal of the inverter is electrically connected to another terminal of the first MOSFET and another terminal of the second MOSFET, wherein yet another terminal of the first MOSFET is electrically connected to one of the set of predetermined voltage levels, and yet another terminal of the second MOSFET is electrically connected to another of the set of predetermined voltage levels.

11. The apparatus of claim 10, wherein the inverter further comprises:
a third MOSFET, having a gate terminal electrically connected to the output terminal of the inverter and having other terminals, wherein one of the other terminals of the third MOSFET is electrically connected to the one of the set of predetermined voltage levels, and another of the other terminals of the third MOSFET is electrically connected to the output terminal of the inverter.

12. The apparatus of claim 1, wherein the apparatus comprises the receiver.

* * * * *